(12) United States Patent
Abe et al.

(10) Patent No.: US 10,528,270 B2
(45) Date of Patent: Jan. 7, 2020

(54) MEMORY SYSTEM HAVING NONVOLATILE MEMORY AND VOLATILE MEMORY AND PROCESSOR SYSTEM

(71) Applicant: KABUSHIKI KAISHA TOSHIBA, Tokyo (JP)

(72) Inventors: Keiko Abe, Kanagawa (JP); Hiroki Noguchi, Kanagawa (JP); Susumu Takeda, Kanagawa (JP); Kumiko Nomura, Tokyo (JP); Shinobu Fujita, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 315 days.

(21) Appl. No.: 15/456,209

(22) Filed: Mar. 10, 2017

(65) Prior Publication Data

US 2018/0081570 A1    Mar. 22, 2018

(30) Foreign Application Priority Data

Sep. 20, 2016  (JP) .................................. 2016-183313

(51) Int. Cl.
*G06F 3/06* (2006.01)
*G11C 11/406* (2006.01)
*G06F 11/16* (2006.01)

(52) U.S. Cl.
CPC .......... *G06F 3/0616* (2013.01); *G06F 3/0619* (2013.01); *G06F 3/0629* (2013.01); *G06F 3/0655* (2013.01); *G06F 3/0683* (2013.01); *G06F 11/1612* (2013.01); *G06F 2201/81* (2013.01); *G11C 11/406* (2013.01)

(58) Field of Classification Search
CPC .... G06F 3/0616; G06F 3/0619; G06F 3/0629; G06F 3/0655; G06F 3/0683; G06F 11/1048; G06F 11/1612; G06F 2201/81; G11C 11/406
See application file for complete search history.

(56) References Cited

U.S. PATENT DOCUMENTS

| | | | |
|---|---|---|---|
| 8,078,923 B2 | 12/2011 | Nagadomi et al. | |
| 8,572,333 B2 | 10/2013 | Confalonieri et al. | |
| 8,924,661 B1* | 12/2014 | Shachar | G06F 13/1668 365/189.2 |
| 9,070,743 B2 | 6/2015 | Bedeschi et al. | |
| 9,405,608 B2 | 8/2016 | Okubo et al. | |

(Continued)

FOREIGN PATENT DOCUMENTS

| | | |
|---|---|---|
| JP | 2005-309683 | 11/2005 |
| JP | 2009-87509 | 4/2009 |

(Continued)

*Primary Examiner* — Kyle Vallecillo
(74) *Attorney, Agent, or Firm* — Finnegan, Henderson, Farabow, Garrett & Dunner, L.L.P.

(57) ABSTRACT

A memory system has a nonvolatile memory to have a memory capacity equal to or less than a memory capacity of a volatile memory, and store at least a part of data stored in the volatile memory, a first controller to refresh data in the volatile memory, and a second controller to overwrite the nonvolatile memory with data read from the volatile memory in a first period between a second period to refresh data in the volatile memory and a third period to subsequently refresh data in the volatile memory.

20 Claims, 7 Drawing Sheets

(56) References Cited

U.S. PATENT DOCUMENTS

| | | | | |
|---|---|---|---|---|
| 2011/0047440 | A1* | 2/2011 | Blackmon | G06F 11/1008 714/764 |
| 2012/0030419 | A1* | 2/2012 | Chino | G01D 3/022 711/106 |
| 2013/0003451 | A1* | 1/2013 | Bedeschi | G11C 16/3418 365/163 |
| 2015/0206574 | A1* | 7/2015 | Greathouse | G06F 13/1636 711/103 |
| 2015/0254003 | A1* | 9/2015 | Lee | G06F 13/382 711/103 |
| 2015/0302924 | A1 | 10/2015 | Bedeschi et al. | |
| 2015/0325291 | A1* | 11/2015 | Aue | G11C 13/0033 365/222 |
| 2017/0062038 | A1* | 3/2017 | Doo | G06F 13/1636 |

FOREIGN PATENT DOCUMENTS

| | | |
|---|---|---|
| JP | 2013-513195 | 4/2013 |
| JP | 5549956 | 7/2014 |
| JP | 2014-157391 | 8/2014 |
| JP | 2015-052938 | 3/2015 |
| JP | 5834303 | 12/2015 |

* cited by examiner

MEMORY SYSTEM HAVING NONVOLATILE MEMORY AND VOLATILE MEMORY AND PROCESSOR SYSTEM

CROSS REFERENCE TO RELATED APPLICATIONS

This application is based upon and claims the benefit of priority from the prior Japanese Patent Application No. 2016-183313, filed on Sep. 20, 2016, the entire contents of which are incorporated herein by reference.

FIELD

Embodiments of the present disclosure relate to a memory system and a processor system.

BACKGROUND

An MRAM (Magnetoresistive Random Access Memory) can be rewritten at high speed compared to other nonvolatile memories. Thus, it is considered that the MRAM is applied to a working memory such as a main memory and a cache memory. When an MTJ element as a storage element of the MRAM is enabled to be accessed at high speed in order to apply the MRAM to a cache memory. It is likely that data retention characteristics deteriorate and data retention time becomes short under high temperature conditions. It is possible to keep data retention characteristics by performing verify writing after accessing the MRAM to write data therein, but the data may possibly disappear when the access interval becomes longer than the data retention time.

In order to lengthen data retention time, nonvolatile memories including the MRAM are written with data frequently under high stress conditions of high voltage and long pulse. This leads to a problem that rewriting resistance deteriorates due to the increase in power consumption and stress on memory elements.

DETAILED DESCRIPTION

Figure 1:
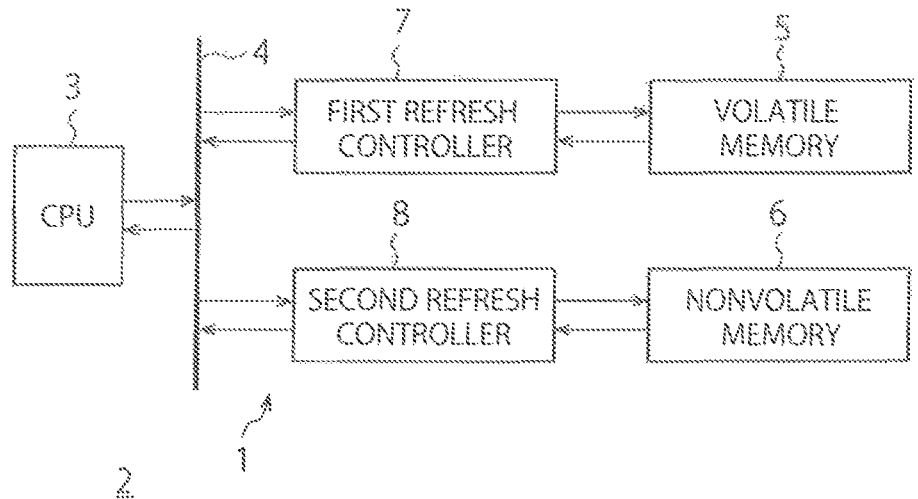
FIG. 1 is a block diagram showing a schematic structure of a processor system having a memory system according to a first embodiment.

According to one embodiment, a memory system has a nonvolatile memory to have a memory capacity equal to or less than a memory capacity of a volatile memory, and store at least a part of data stored in the volatile memory, a first controller to refresh data in the volatile memory, and a second controller to overwrite the nonvolatile memory with data read from the volatile memory in a first period between a second period to refresh data in the volatile memory and a third period to subsequently refresh data in the volatile memory.

Hereinafter, embodiments of the present disclosure will be explained referring to the drawings.

(First Embodiment)

FIG. 1 is a block diagram showing a schematic structure of a processor system 2 having a memory system 1 according to a first embodiment. The processor system 2 of FIG. 1 has a processor (CPU: Central Processing Unit) 3 and the memory system 1. The processor 3 and memory system 1 transmit and receive data, addresses, and various control signals to and from each other through a bus 4. The bus 4 includes a plurality of kinds of buses 4 such as a data bus for transmitting and receiving data, an address bus for transmitting and receiving addresses, and a control signal bus for transmitting and receiving various control signals.

The memory system 1 has a volatile memory 5, a nonvolatile memory 6, a first refresh controller (first controller) 7, and a second refresh controller (second controller) 8.

The volatile memory 5 may be incorporated into the memory system 1, or may be removably connected to the memory system 1. The volatile memory 5 is formed using a DRAM (Dynamic Random Access Memory), for example. The volatile memory 5 is required to be refreshed periodically to retain the data stored therein. The refreshing means reading stored data and writing the read data again. The refreshing is performed every tens to hundreds of ms, for example.

The memory capacity of the nonvolatile memory 6 is equal to or less than the memory capacity of the volatile memory 5. The nonvolatile memory 6 stores at least a part of data stored in the volatile memory 5. Within the data stored in the volatile memory 5, such data as frequently accessed by the processor 3 is typically stored in the nonvolatile memory 6. The nonvolatile memory 6 is desirably a memory which can be accessed at high speed, such as an MRAM.

When the access performance of the nonvolatile memory 6 is higher than that of the volatile memory 5, the nonvolatile memory 6 can be utilized as a memory having a higher access priority than the volatile memory 5. For example, it is possible to use the nonvolatile memory 6 as a cache memory while using the volatile memory 5 as a cache memory having a lower access priority than the nonvolatile memory 6 or as a main memory. In this case, the processor 3 accesses the nonvolatile memory 6 before accessing the volatile memory 5. For example, when the processor 3 writes data, the processor 3 writes the data in the nonvolatile memory 6 before writing it in the volatile memory 5, The data written in the nonvolatile memory 6 is also written in the volatile memory 5 later. When the processor 3 writes data in the nonvolatile memory 6, the data may be written in the volatile memory 5 in a write-through mode as a basic action.

The first refresh controller 7 refreshes the data in the volatile memory 5. The refreshing is performed on at least a part of memory area in the volatile memory 5 at predetermined time intervals. More specifically, the first refresh controller 7 performs refreshing at predetermined time intervals in a period in which the processor 3 does not access the volatile memory 5.

The second refresh controller 8 overwrites the nonvolatile memory 6 with data read from the volatile memory 5 in a period between a refresh period for the first refresh controller 7 to refresh the data in the volatile memory 5 and a refresh period subsequent thereto.

Figure 2:
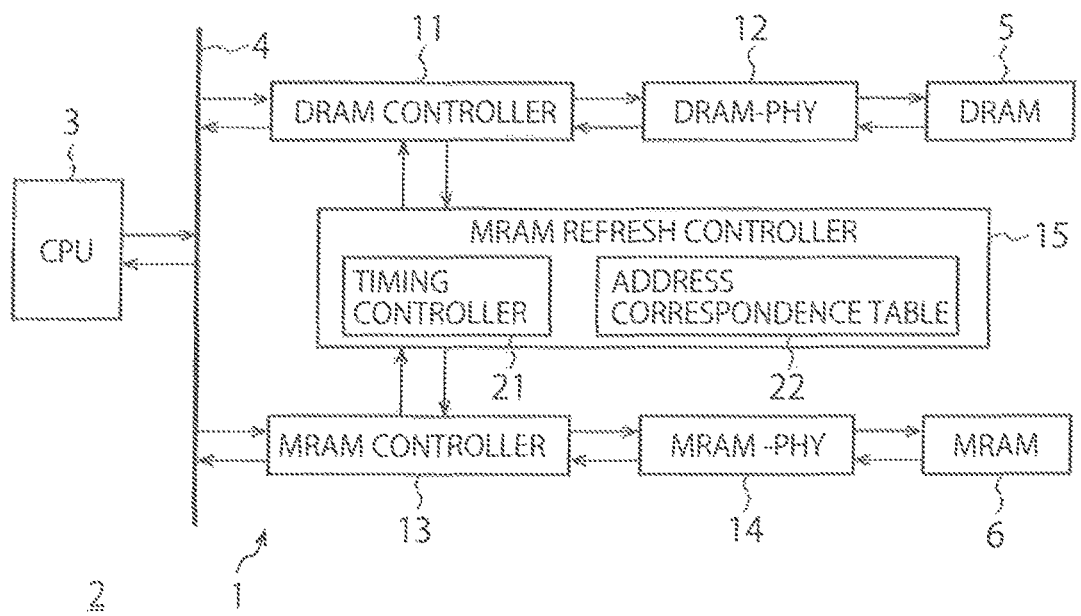
FIG. 2 is a block diagram showing a schematic structure of a further concretized processor system derived from FIG. 1.

FIG. 2 is a block diagram showing a schematic structure of a processor system 2 which is concreted more specifically than FIG. 1. In the example shown in FIG. 2, a DRAM 5 is used as the volatile memory 5 and an MRAM 6 is used as the nonvolatile memory 6. In addition to the processor 3 (CPU) and the bus 4, the processor system 2 of FIG. 2 has the DRAM 5, a DRAM controller 11, a DRAM-PHY 12, the MRAM 6, an MRAM controller 13, an MRAM-PHY 14, and an MRAM refresh controller 15.

The DRAM controller 11 receives an access request from the processor 3 and controls the access to the DRAM 5. The DRAM-PHY 12 is an interface to connect the DRAM 5 and DRAM controller 11 in accordance with the standards of the DRAM 5 to be mounted. The DRAM controller 11 has the function of the first refresh controller 7 shown in FIG. 1. The DRAM controller 11 has a function of receiving a command request from the MRAM refresh controller 15 to transmit and receive data.

The MRAM controller 13 receives an access request from the processor 3 and controls the access to the MRAM 6. The MRAM-PHY 14 is an interface to connect the MRAM 6 and MRAM controller 13 in accordance with the standards of the MRAM 6 to be mounted. The MRAM controller 13 has a function of receiving a command request from the MRAM refresh controller 15 to transmit and receive data.

The MRAM refresh controller 15 has the function of the second refresh controller 8 shown in FIG. 1, and controls refreshing of the MRAM 6. The MRAM refresh controller 15 has a timing controller 21 and an address correspondence table 22. The timing controller 21 controls the timing for refreshing the MRAM 6. The address correspondence table 22 is an association storage to store information associating the data in the MRAM 6 with the data in the DRAM 5. The address correspondence table 22 is formed using a register or an SRAM, for example. Further, the MRAM refresh controller 15 has a function of transmitting and receiving commands and data to and from the DRAM controller 11 and MRAM controller 13. Having the function of transmitting and receiving commands and data means having a system and a buffer region to input/output commands and data, for example.

Figure 3:
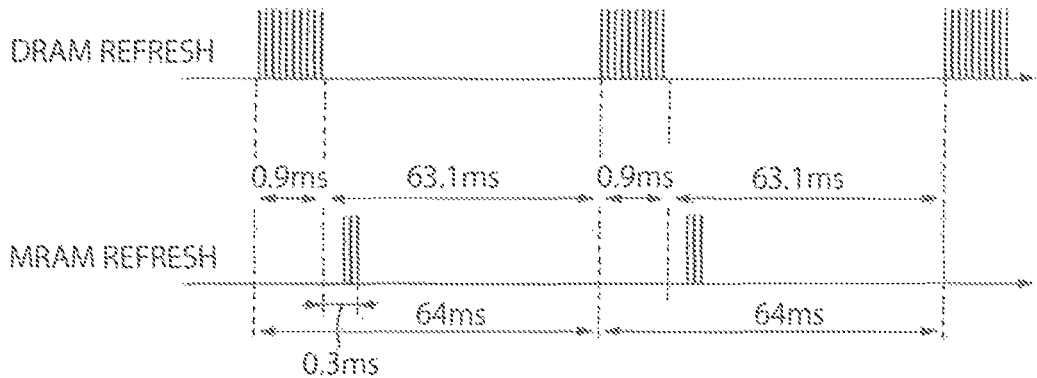
FIG. 3 is a diagram showing the timings to refresh a DRAM and an MRAM.

FIG. 3 is a diagram showing the timings to refresh the DRAM 5 and MRAM 6. Refreshing of the DRAM 5 is performed with respect to the whole or a part of memory area in the DRAM 5 at predetermined time intervals in a period in which the processor 3 does not access the DRAM 5. The period in which the processor 3 does not access includes a period in which the processor 3 does not access any memory while operating normally and a period in which the processor 3 is in a sleep mode.

FIG. 3 shows an example of refreshing the DRAM 5 every 64 ms. In the example of FIG. 3, the DRAM 5 has a memory capacity of 1 giga byte. When the DRAM 5 is refreshed 8192 times on a 128-kbyte basis and 110 ns are taken to access the DRAM 5 each time, the time required to refresh the whole memory area in the DRAM 5 is about 0.9 ms (=110 ns×8192). Thus, when the refreshing is performed at 64 ms intervals, 63.1 ms (=64−0.9) of vacant time arises.

Accordingly, the timing controller 21 in the MRAM refresh controller 15 refreshes the MRAM 6 utilizing this vacant time. For example, when data is transferred from the DRAM 5 at a rate of 12.8 GBbps, it takes 0.01 ms to transfer 1 megabyte from the DRAM 5 to the MRAM 6. Writing 1 Mbyte of data in the MRAM 6 requires 0.0195 ms (=5 ns×1 M/256). The total of these periods is 0.03 ms or less. Even when the MRAM 6 and DRAM 5 have the same memory capacity, the time required to refresh the MRAM 6 is one tenth of that required to refresh the DRAM 5, which makes it possible to refresh the NRAM 6 in good time between the Intervals of refreshing the DRAM 5.

Figure 4:
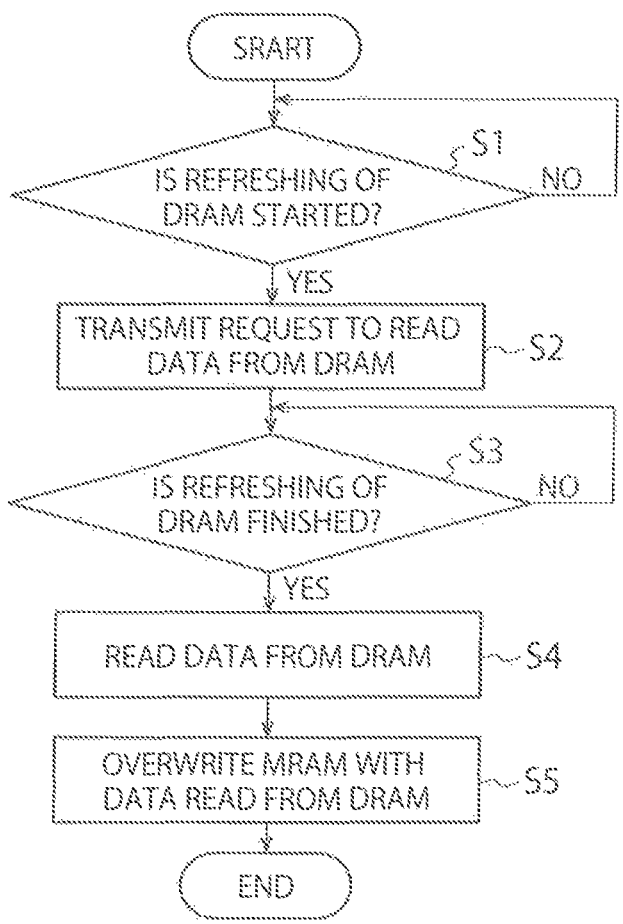
FIG. 4 is a flow chart showing a procedure for refreshing the MRAM according to the first embodiment.

FIG. 4 is a flow chart showing a procedure for refreshing the MRAM 6 according to the first embodiment. First, the MRAM refresh controller 15 judges whether refreshing of the DRAM 5 is started (Step S1). Here, the MRAM refresh controller 15 monitors commands issued from the DRAM controller 11 to the DRAM 5, and senses that refreshing of the DRAM 5 is started when a refresh command is issued. More specifically, the timing controller 21 in the MRAM refresh controller 15 receives control signals of the DRAM controller 11. When the timing controller 21 receives a refresh command, the process of Step S2 and subsequent steps is started.

At Step S2, the MRAM refresh controller 15 refers to the address correspondence table 22 and transmits, to the DRAM controller 11, a request to read the data stored in the DRAM 5 corresponding to the data in the MRAM 6.

After that, the MRAM refresh controller 15 waits until refreshing of the DRAM 5 is finished (Step S3). When refreshing of the DRAM 5 is finished, the DRAM controller 11 reads the corresponding data from the DRAM 5 and transmits it to the MRAM refresh controller 15, in accordance with the request of Step S2 (Step S4).

The MRAM refresh controller 15 overwrites the corresponding data in the MRAM 6 with the data read from the DRAM 5 (Step S5). In this way, the MRAM 6 is refreshed. The DRAM 5 is refreshed by reading data from the DRAM 5 and writing the read data therein again. On the other hand, the MRAM 6 of the present embodiment is refreshed by writing the data read from the DRAM 5 over the corresponding data in the MRAM 6. This is based on the assumption that the data in the DRAM 5 is more reliable than the data in the MRAM 6. Refreshing the MRAM 6 using the data in the DRAM 5 makes it possible to let the MRAM 6 have retention characteristics equivalent to those of the DRAM 5.

At the above Step S4, the data to be written is read from the DRAM 5 after the refreshing of the DRAM 5 is finished. This is because the data read from the DRAM 5 to refresh the DRAM 5 is scarcely outputted to the outside of the DRAM 5. If the data read from the DRAM 5 for refreshing can be outputted to the outside, the MRAM 6 may be overwritten with this data.

As stated above, in the first embodiment, the nonvolatile memory 6 is overwritten with the data read from the DRAM 5 between a refresh period of the DRAM 5 and a refresh period subsequent thereto, which makes it possible to refresh the MRAM 6 at a refresh frequency equivalent to that of the DRAM 5 by using the data in the DRAM 5, and to let the MRAM 6 continuously have retention characteristics equivalent to those of the DRAM 5.

(Second Embodiment)

A second embodiment is characterized in that the MRAM 6 is refreshed when there is an error in the data in the MRAM 6.

Figure 5:
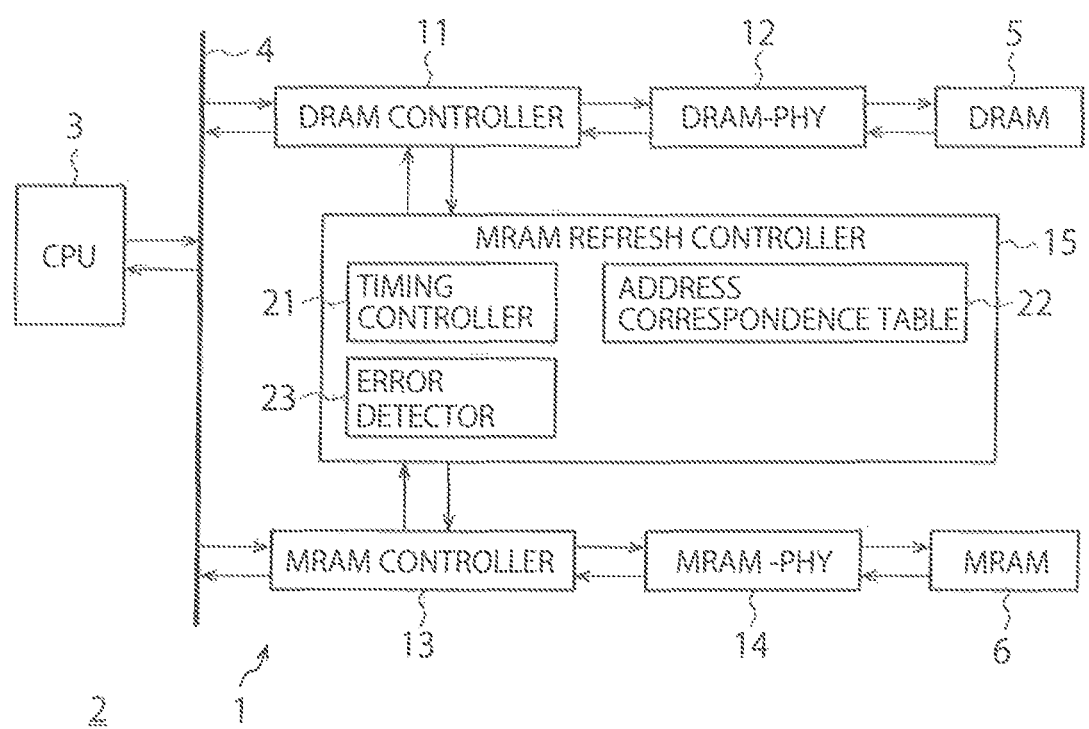
FIG. 5 is a block diagram showing a schematic structure of the processor system according to a second embodiment.

FIG. 5 is a block diagram showing a schematic structure of the processor system 2 according to the second embodiment. The processor system 2 of FIG. 5 is different from FIG. 2 in the internal structure of the MRAM refresh controller 15, and the other components are the same.

In addition to the timing controller 21 and address correspondence table 22 of FIG. 2, the MRAM refresh controller 15 of FIG. 5 has an error detector 23. The error detector 23 detects whether the data read from the DRAM 5 is different from the corresponding data in the MRAM 6. The error detector 23 may be mounted on a readout circuit in the MRAM 6. The MRAM refresh controller 15 overwrites only erroneous data in the MRAM 6 detected by the error detector 23 with the data read from the DRAM 5. This makes it possible to reduce the frequency of writing data in the MRAM 6 compared to the case of overwriting the whole data in the MRAM 6.

Figure 6:
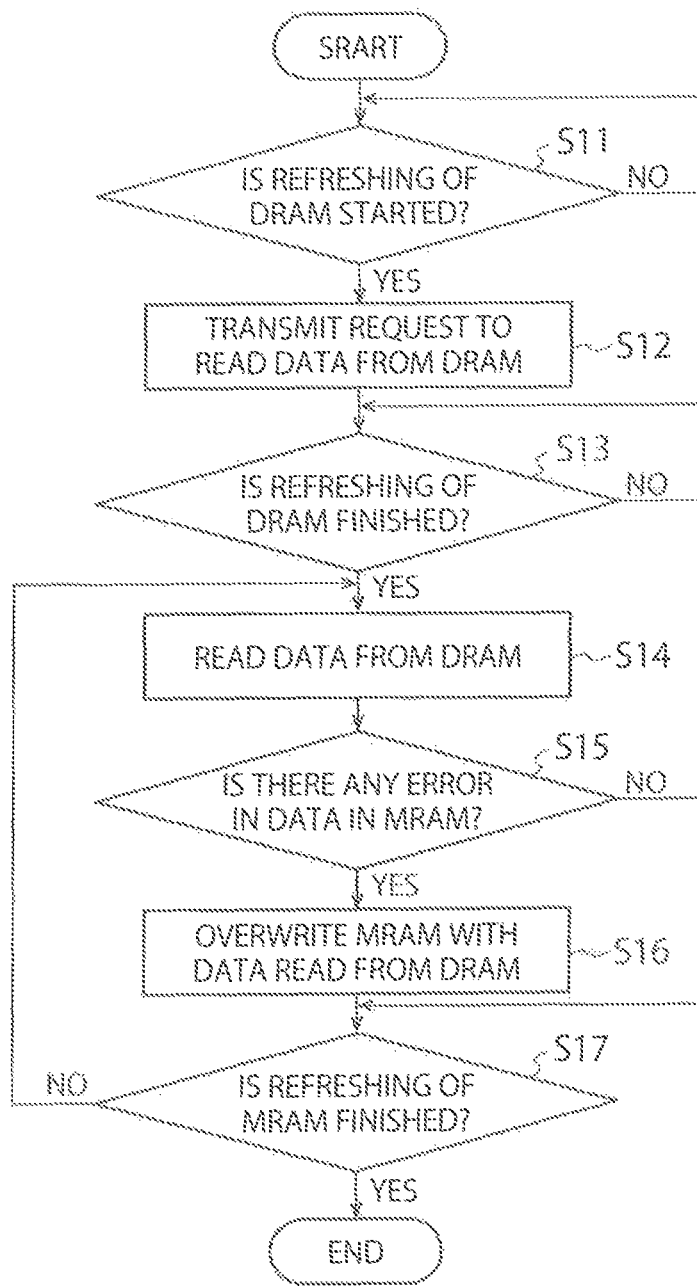
FIG. 6 is a flow chart showing a procedure for refreshing the MRAM according to the second embodiment.

FIG. 6 is a flow chart showing a procedure for refreshing the MRAM 6 according to the second embodiment. Steps S11 to S14 of FIG. 6 are the same as Steps S1 to S4 of FIG. 4. The error detector 23 compares the data read from the DRAM 5 with the corresponding data read from the MRAM 6 to detect whether there is an error in the corresponding data in the MRAM 6 (Step S15). Here, the detection of erroneous data is performed on a line basis, the line being a unit to read the data in the MRAM 6. The line is data consisting of a plurality of bits. When an error is detected, the data read from the DRAM 5 is written over the corresponding data in the MRAM 6 (Step S15). The process of Steps S15 and S16 may be performed by read and write circuits in the MRAM 6, or may be performed by the MRAM controller 13.

When no error is detected at Step S15, or when Step S16 is finished, it is judged whether refreshing of the MRAM 6 is finished (Step S16). If unrefreshed data remains in the MRAM 6, the process of Step S14 and subsequent steps is repeated. If it is judged that there is no unrefreshed data in the MRAM 6 at Step S16, the process is finished.

In this way, the DRAM 5 and MRAM 6 are refreshed with respect to each bit string data (line data) consisting of a plurality of bits as a unit. When comparing the data read from the DRAM 5 with the corresponding data in the MRAM 6, the error detector 23 detects whether there is an error in each bit or line. For example, when there is an error in a part of bits in the data read from the MRAM 6, the MRAM 6 may be overwritten with the line data read from the DRAM 5, or may be overwritten with only erroneous bits detected by the error detector 23 in the line data read from the DRAM 5.

As stated above, in the second embodiment, the data read from the DRAM 5 is written over the corresponding data in the MRAM 6 only when the data read from the DRAM 5 is different from the corresponding data in the MRAM 6. Since the volume of data to be refreshed can be reduced, power consumption can be reduced. Further, since the frequency of writing data in the MRAM 6 can be reduced, the reliability of the MRAM chip can be improved.

(Third Embodiment)

A third embodiment is characterized in that the cycle of refreshing the MRAM 6 is controlled depending on the frequency of error in the data in the MRAM 6.

Figure 7:
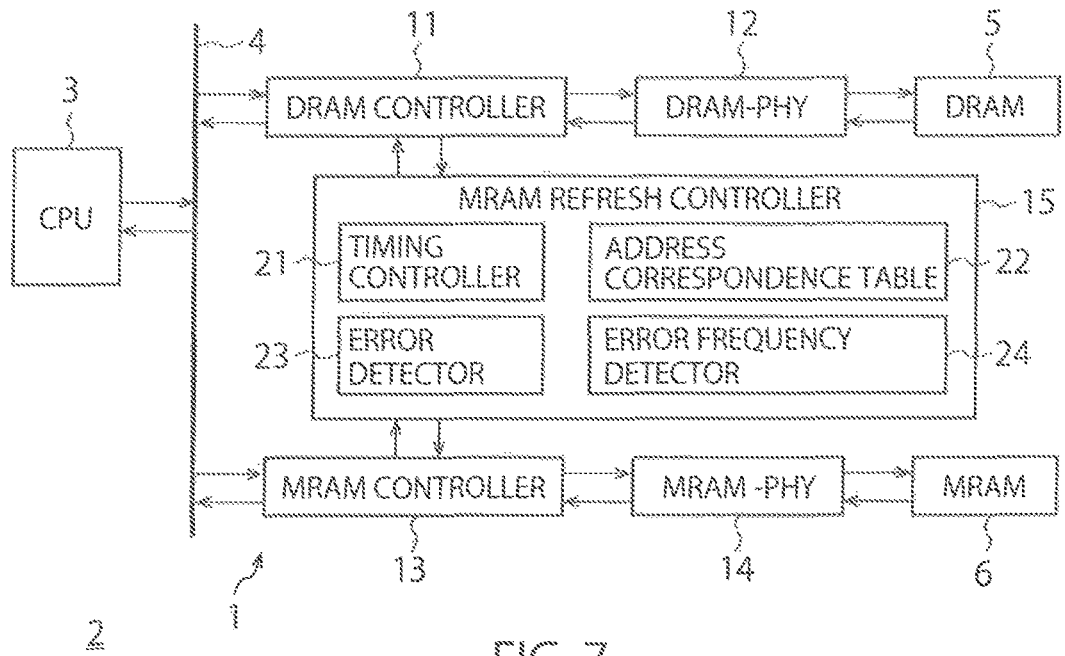
FIG. 7 is a block diagram showing a schematic structure of the processor system according to a third embodiment.

FIG. 7 is a block diagram showing a schematic structure of the processor system 2 according to the third embodiment. The processor system 2 of FIG. 7 is different from FIG. 5 in the internal structure of the MRAM refresh controller 15, and the other components are the same.

In addition to the timing controller 21, address correspondence table 22, and error detector 23 of FIG. 5, the MRAM refresh controller 15 of FIG. 7 has an error frequency detector 24.

The error frequency detector 24 detects the frequency of error in the data stored in the MRAM 6. More specifically, the error frequency detector 24 detects e.g. the number of data errors or rate of bit errors in the MRAM 6 per unit time as the frequency of error, based on the detection result of the error detector 23.

The timing controller 21 controls the refresh period based on the frequency of error detected by the error frequency detector 24. More concretely, the timing controller 21 increases the frequency of refreshing as the frequency of error increases. As an example, when the frequency of error is low, the MRAM 6 is refreshed once a plurality of refresh periods of the DRAM 5, and when the frequency of error is high, the MRAM 6 is refreshed each time the refresh period of the DRAM 5 ends.

The third embodiment can be combined with the first or second embodiment. That is, the timing controller 21 controls the refresh intervals in the process of the flow chart of FIG. 4 or 6 depending on the frequency of error in the MRAM 6.

As stated above, in the third embodiment, the cycle of refreshing the MRAM 6 is controlled depending on the frequency of error in the data in the MRAM 6. Accordingly, when the frequency of error in the MRAM 6 increases due to the rise in temperature etc., the refresh cycle is shortened to prevent the deterioration of data retention characteristics. Further, when the frequency of error in the MRAM 6 is low, the refresh cycle is lengthened to reduce the number of times of writing the MRAM 6 and power consumption.

(Fourth Embodiment)

A fourth embodiment is characterized in that the MRAM 6 is refreshed with respect to error bits and lines of data in the MRAM 6 while error correction based on ECC (Error Checking and Correcting) is available.

Figure 8:
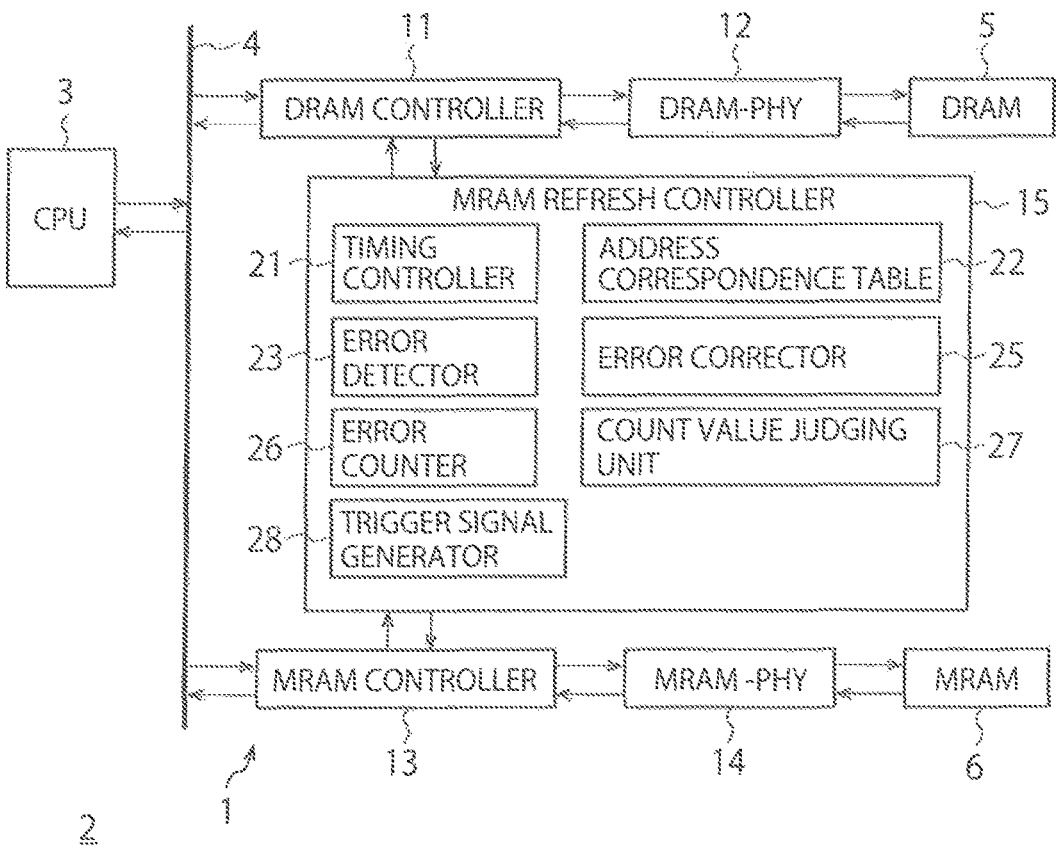
FIG. 8 is a block diagram showing a schematic structure of the processor system according to a fourth embodiment.

FIG. 8 is a block diagram showing a schematic structure of the processor system 2 according to the fourth embodiment. The processor system 2 of FIG. 8 is different from FIG. 2 in the internal structure of the MRAM refresh controller 15, and the other components are the same.

In addition to the timing controller 21 and address correspondence table 22 of FIG. 2, the MRAM refresh controller 15 of FIG. 8 has the error detector 23, an error corrector 25, an error counter 26, a count value judging unit 27, and a trigger signal generator 28.

The error detector 23 detects whether there is an error in each bit or line in the data in the MRAM 6. The error corrector 25 corrects a predetermined number of error bits included in the data in the nonvolatile memory 6. The error counter 26 counts up when it is detected that the data read from the DRAM 5 includes any bits different from the corresponding data in the MRAM 8. The count value judging unit 27 judges whether the count value of the error counter 26 is over a predetermined threshold value.

The MRAM refresh controller 15 overwrites the MRAM 6 with the data read from the DRAM 5 when the count value judging unit 27 judges that the count value is over the threshold value.

The trigger signal generator 28 generates and outputs a trigger signal when the count value judging unit 27 judges that the count value is over the threshold value. The trigger signal is a signal instructing to refresh the MRAM 6. When the trigger signal is outputted, the MRAM refresh controller 15 starts a procedure for refreshing (mentioned later). As the number of errors in the MRAM 6 increases, the count value of the error counter 26 increases and the trigger signal is outputted at earlier timing. That is, as the number of bit errors in the MRAM 6 increases, the refresh cycle becomes shorter.

Figure 9:
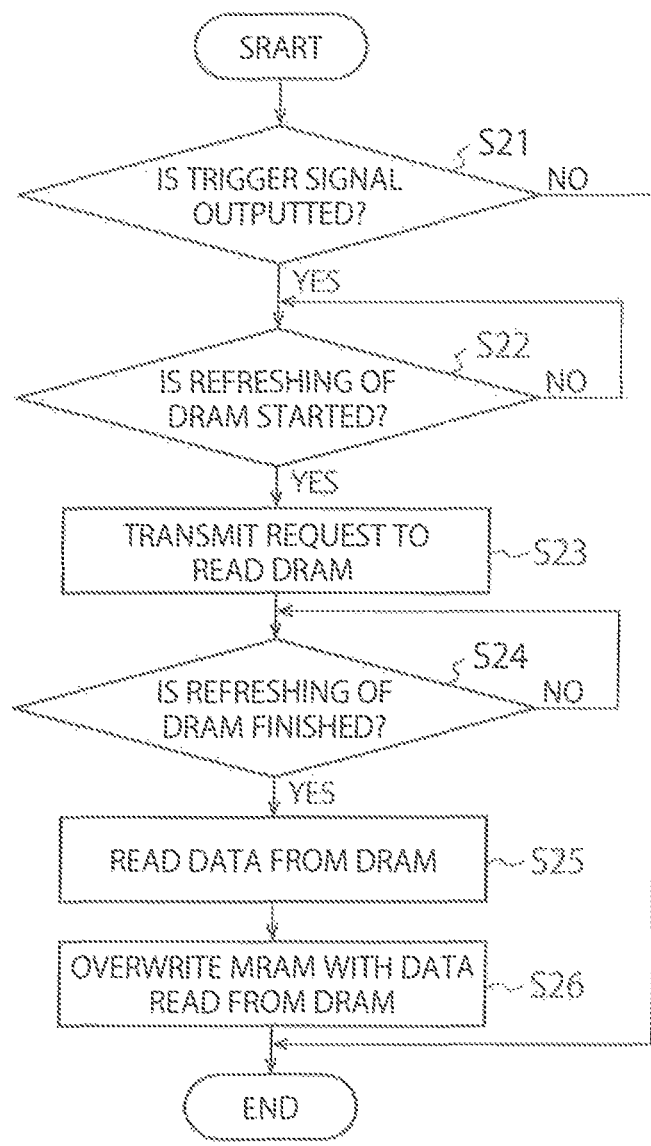
FIG. 9 is a flow chart showing a procedure for refreshing the MRAM according to the fourth embodiment.

FIG. 9 is a flow chart showing a procedure for refreshing the MRAM 6 according to the fourth embodiment. First, the MRAM refresh controller 15 judges whether a trigger signal is outputted from the trigger signal generator 28 (Step S21). When no trigger signal is outputted, the process of FIG. 9 ends without refreshing the MRAM 6. When a trigger signal is outputted, the timing controller 21 judges whether refreshing of the DRAM 5 is started (Step S22), and if not started yet, the timing controller 21 waits until the refreshing of the DRAM 5 is started. Here, the timing controller 21 monitors the issuance of a command to refresh the DRAM 5, and when a refresh command is issued, the timing controller 21 judges that refreshing of the DRAM 5 is started.

When refreshing of the DRAM 5 is started, the MRAM refresh controller 15 refers to the address correspondence table 22 and transmits, to the DRAM controller 11, a request to read the data stored in the DRAM 5 corresponding to the data in the MRAM 6 (Step S23).
The read request to be transmitted at this time may correspond to the whole or a part of data in the MRAM 6.

When refreshing of the DRAM 5 is finished (Step S24), the DRAM controller 11 reads the data in the DRAM 5 and transmits it to the MRAM refresh controller 15, in accordance with the read request of Step S23 (Step S25).

Lastly, the data read from the DRAM 5 is written over the corresponding data in the MRAM 6 (Step S26). When there is an error in a part of bits in the data read from the MRAM 6, the MRAM 6 may be overwritten with the line data read from the DRAM 5, or may be overwritten with only erroneous bits detected by the error detector 23 in the line data read from the DRAM 5. At this time, the process of Step S26 may be performed by read and write circuits in the MRAM 6.

Figure 10:
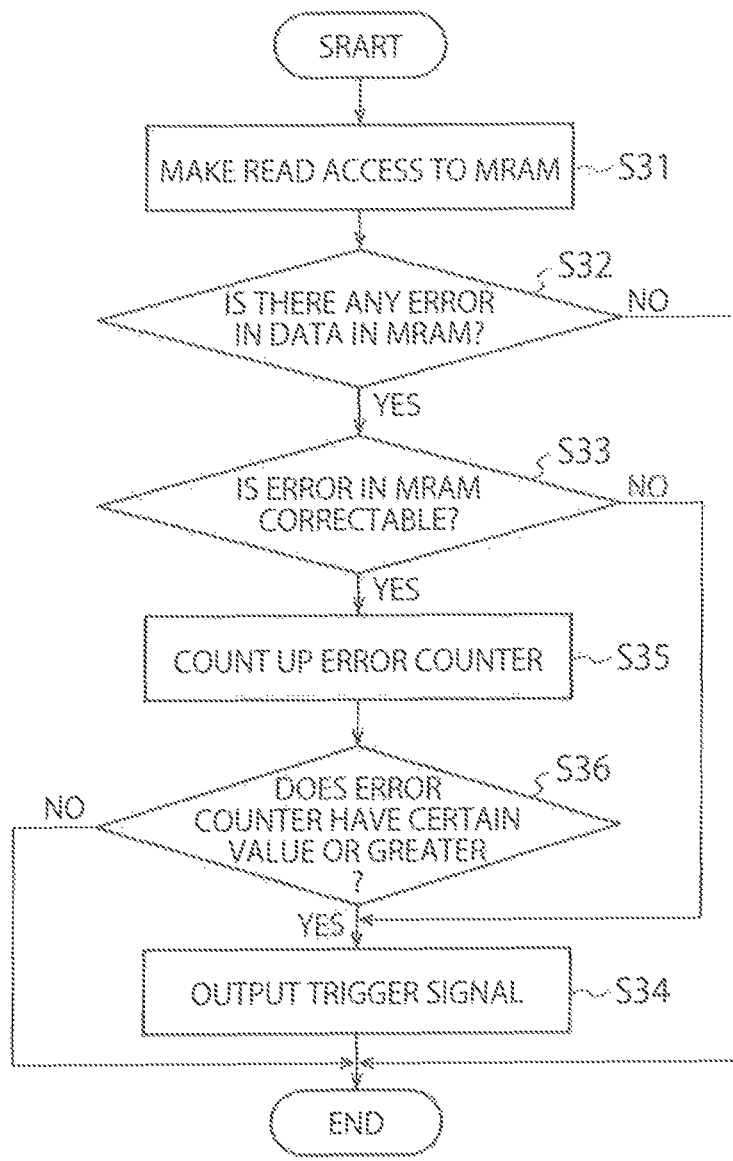
FIG. 10 is a flow chart showing a procedure for outputting a trigger signal for the MRAM according to the fourth embodiment.

FIG. 10 is a flow chart showing a procedure for outputting a trigger signal for the MRAM 6 according to the fourth embodiment. First, when the processor 3 makes a read access to the MRAM 6 through the MRAM controller 13, the process of FIG. 10 is started (Step S31). Next, data in the MRAM 6 is read, subjected to error correction based on the ECC process, and transferred to the CPU 3 as data read from the MRAM 6. That is, whether there is a data error in the MRAM 6 is judged (Step S32), and if there is an error, the error is corrected as long as it corresponds to a correctable number of bits or less (Step S33, correctability judging unit).

When it is judged that the error correction is impossible at Step S33, a trigger signal is outputted (Step S34). At this time, outputting the trigger signal together with corresponding addresses can limit the addresses to be refreshed in the MRAM, which leads to the reduction in refresh time and power consumption.

When it is judged that the error correction is possible at Step S33, the error counter 26 counts up (Step S35). When the value of the error counter reaches a certain value or greater (Step S36), a trigger signal is outputted (Step S34).

In this fourth embodiment, the error detector 23 and error corrector 25 may be mounted on read and write circuits in the MRAM 6, or may be mounted on the MRAM controller 13.

As stated above, in the fourth embodiment, when the number of bit errors in the data in the MRAM 6 is over a correctable error limit, a trigger signal is immediately outputted, and when the number of bit errors is within the correctable error range, the error counter 26 counts up and refreshes the MRAM 6 when the count value of the error counter 26 is over a threshold value. In this way, refresh timing of the MRAM 6 can be variably controlled depending on the error level of the MRAM 6. Thus, the MRAM 6 can be refreshed minimally while keeping retention characteristics, which leads to the reduction in power consumption and the number of times of rewriting.

In the above first to fourth embodiments, after the DRAM 5 is refreshed, the MRAM 6 is refreshed using the data read from the DRAM 5. However, the data to be refreshed in the MRAM 6 may be stored in a high-speed volatile memory (e.g., SRAM) provided separately from the DRAM 5 in order that the data to be refreshed in the MRAM 6 is read from the SRAM, not from the DRAM 5. In this case, when the processor 3 issues a request to write data, the data should be written not only in the DRAM 5 but also in the SRAM in order to utilize the data in the SRAM to refresh the MRAM 6 before the data in the SRAM is discharged to the DRAM 5.

In the above third and fourth embodiment, whether there is an error in the data in the MRAM 6 is detected, but an ambient temperature may be measured instead of or in addition to the frequency of error to shorten the refresh interval when the ambient temperature is out of a predetermined range.

In the above first to fourth embodiments explained above, the DRAM 5 is used as the volatile memory 5 and the MRAM 6 is used as the nonvolatile memory 6, which is merely an example and thus other types of volatile memory 5 and nonvolatile memory 6 may be used instead.

Further, similarly to the nonvolatile memory 6, the volatile memory 5 may be removably connected to the memory system 1 in the style of DIMM (Dual Inline Memory Module), for example. The volatile memory 5 may be mounted on one chip together with the processor 3, or both of the volatile memory 5 and nonvolatile memory 6 may be mounted on one chip together with the processor 3. That is, how to mount the volatile memory 5 and nonvolatile memory 6 is not particularly questioned.

At least a part of the processor system 2 and memory system 1 explained in the above embodiment may be formed of hardware or software. In the case of software, a program realizing at least a partial function of the processor system 2 and memory system 1 may be stored in a recording medium such as a flexible disc, CD-ROM, etc. to be read and executed by a computer. The recording medium is not limited to a removable medium such as a magnetic disk, optical disk, etc., and may be a fixed-type recording medium such as a hard disk device, memory, etc.

Further, a program realizing at least a partial function of the processor system 2 and memory system 1 can be distributed through a communication line (Including radio communication) such as the Internet. Furthermore, this program may be encrypted, modulated, and compressed to be distributed through a wired line or a radio link such as the Internet or through a recording medium storing it therein.

While certain embodiments have been described, these embodiments have been presented by way of example only, and are not intended to limit the scope of the disclosures. Indeed, the novel methods and systems described herein may be embodied in a variety of other forms; furthermore, various omissions, substitutions and changes in the form of the methods and systems described herein may be made without departing from the spirit of the disclosures. The accompanying claims and their equivalents are intended to cover such forms or modifications as would fall within the scope and spirit of the disclosures.

The invention claimed is:

1. A memory system comprising:
   a nonvolatile memory to have a memory capacity equal to or less than a memory capacity of a volatile memory, and store at least a part of data stored in the volatile memory;
   a first controller to refresh data in the volatile memory; and
   a second controller to overwrite the nonvolatile memory with data read from the volatile memory in a first period between a second period to refresh data in the volatile memory and a third period to subsequently refresh data in the volatile memory.

2. The memory system of claim 1, wherein the second controller overwrites, in the first period, the data read from the volatile memory, in at least a partial memory area of the nonvolatile memory.

3. The memory system of claim 1, further comprising:
   an information storage to store association information that associates an address of data in the nonvolatile memory with an address of data in the volatile memory,
   wherein the second controller overwrites the nonvolatile memory with the data read from the volatile memory, based on the association information.

4. The memory system of claim 1, wherein the second controller waits until the first controller finishes refreshing data in the volatile memory, and reads the data from the volatile memory to overwrite the nonvolatile memory with the read data in the first period.

5. The memory system of claim 1, wherein the second controller controls whether or not to overwrite the nonvolatile memory with the data read from the volatile memory on a bit or line basis.

6. The memory system of claim 1, wherein the second controller overwrites the nonvolatile memory with the data read from the volatile memory in a period when a processor is in a sleep mode.

7. The memory system of claim 1, further comprising:
   an error detector to detect whether the data read from the volatile memory is different from corresponding data in the nonvolatile memory,
   wherein when a difference is detected by the error detector, the second controller overwrites the nonvolatile memory with the data read from the volatile memory.

8. The memory system of claim 7, wherein the second controller overwrites a bit different from a corresponding bit of data in the nonvolatile memory among bits included in the data read from the volatile memory, based on a detection result of the error detector.

9. The memory system of claim 1, further comprising:
   an error frequency detector to detect a frequency of error in data stored in the nonvolatile memory,
   wherein the second controller controls a refresh cycle for overwriting the nonvolatile memory with the data read from the volatile memory, based on the frequency of error.

10. The memory system of claim 9, further comprising:
    an error corrector to correct an error bit within a predetermined number of bits included in data in the nonvolatile memory;
    a correctability judging unit to judge whether data read from the nonvolatile memory can be corrected by the error corrector;
    a counter to count up when the data read from the nonvolatile memory includes an error and the correctability judging unit judges that the error is correctable;
    a count value judging unit to judge whether a count value of the counter is over a predetermined threshold value; and
    a trigger signal generator to generate a trigger signal when the correctability judging unit judges that the error is uncorrectable or when the count value judging unit judges that the count value is over the threshold value,
    wherein the second controller overwrites the nonvolatile memory with the data read from the volatile memory in the first period after the trigger signal is generated.

11. The memory system of claim 1,
    wherein the nonvolatile memory is a cache memory having a higher priority of access by a processor compared to the volatile memory, and
    when writing data in the nonvolatile memory responding to a write request from the processor, a cache controller writes data in the volatile memory in a write-through mode.

12. The memory system of claim 1,
    wherein the nonvolatile memory has an MRAM (Magnetoresistive Random Access Memory).

13. A processor system comprising:
    a processor; and
    a memory system accessed by the processor,
    wherein the memory system comprises:
    a volatile memory;
    a nonvolatile memory to have a memory capacity equal to or less than a memory capacity of the volatile memory, and store at least a part of data stored in the volatile memory;
    a first controller to refresh data in the volatile memory; and
    a second controller to overwrite the nonvolatile memory with data read from the volatile memory in a first period between a second period to refresh data in the volatile memory and a third period to subsequently refresh data in the volatile memory.

14. The processor system of claim 13, wherein the second controller overwrites, in the first period, the data read from the volatile memory, in at least a partial memory area of the nonvolatile memory.

15. The processor system of claim 13, further comprising:
    an information storage to store association information that associates an address of data in the nonvolatile memory with an address of data in the volatile memory,
    wherein the second controller overwrites the nonvolatile memory with the data read from the volatile memory, based on the association information.

16. The processor system of claim 13, wherein the second controller waits until the first controller finishes refreshing data in the volatile memory, and reads the data from the volatile memory to overwrite the nonvolatile memory with the read data in the first period.

17. The processor system of claim 13, wherein the second controller controls whether or not to overwrite the nonvolatile memory with the data read from the volatile memory on a bit or line basis.

18. The processor system of claim 13, wherein the second controller overwrites the nonvolatile memory with the data read from the volatile memory in a period when a processor is in a sleep mode.

19. The processor system of claim 13, further comprising:
    an error detector to detect whether the data read from the volatile memory is different from corresponding data in the nonvolatile memory, wherein when a difference is detected by the error detector, the second controller overwrites the nonvolatile memory with the data read from the volatile memory.

20. The memory system of claim 19, wherein the second controller overwrites a bit different from a corresponding bit of data in the nonvolatile memory among bits included in the data read from the volatile memory, based on a detection result of the error detector.

\* \* \* \* \*